(12) United States Patent
Welch et al.

(10) Patent No.: US 6,373,300 B2
(45) Date of Patent: Apr. 16, 2002

(54) INTEGRATED CIRCUIT WITH MULTI-FUNCTION CONTROLLED IMPEDANCE OUTPUT DRIVERS

(75) Inventors: M. Jason Welch, Ft. Collins, CO (US); Brian Cardanha, Sunnyvale, CA (US)

(73) Assignee: Agilent Technologies, Inc., Palo Alto, CA (US)

( * ) Notice: Subject to any disclaimer, the term of this patent is extended or adjusted under 35 U.S.C. 154(b) by 0 days.

(21) Appl. No.: 09/753,966

(22) Filed: Jan. 2, 2001

Related U.S. Application Data

(62) Division of application No. 09/298,228, filed on Apr. 22, 1999, now Pat. No. 6,194,924.

(51) Int. Cl.[7] .................................................. H03B 1/00
(52) U.S. Cl. ...................... 327/112; 327/379; 327/566; 326/27; 326/30; 326/82; 307/412
(58) Field of Search ........................ 327/108–112, 379, 327/383, 384, 564, 565, 566; 326/26–28, 30, 80, 82, 86–88, 90, 91; 307/412, 98; 710/101

(56) References Cited

U.S. PATENT DOCUMENTS

| 5,243,229 | A | | 9/1993 | Gabara et al. ................. 307/98 |
|---|---|---|---|---|
| 5,550,496 | A | * | 8/1996 | Desroches ................... 327/108 |
| 5,606,275 | A | | 2/1997 | Farhang et al. ............. 327/108 |
| 5,862,390 | A | | 1/1999 | Ranjan ....................... 713/300 |
| 6,040,714 | A | * | 3/2000 | Klein .......................... 326/86 |
| 6,078,978 | A | * | 6/2000 | Suh ............................. 710/129 |
| 6,222,389 | B1 | * | 4/2001 | Williams ..................... 326/86 |

* cited by examiner

Primary Examiner—Timothy P. Callahan
Assistant Examiner—Minh Nguyen

(57) ABSTRACT

A multi-function output driver that may be used with at least two types of busses includes a multiplexer that shifts calibration bits to the pull-down transistors. This shifting changes which transistors of the transistor array are turned on when the pull-down drive transistors are driving. By changing which transistors are turned on, the impedance of the driver is changed. This shifting is used with a disable function on the pull-up drive-transistors to allow the driver to be used as an end-of-line termination, an open-drain driver, or as a source-terminated driver.

16 Claims, 2 Drawing Sheets

US 6,373,300 B2

INTEGRATED CIRCUIT WITH MULTI-FUNCTION CONTROLLED IMPEDANCE OUTPUT DRIVERS

CROSS-REFERENCE TO RELATED APPLICATIONS

This is a divisional of application Ser. No. 09/298,228 filed on Apr. 22, 1999 is now Pat. No. 6,194,924.

FIELD OF THE INVENTION

This invention relates generally to digital output drivers for integrated circuits. More particularly, it relates to a circuit for changing the impedance of a calibrated output driver so that it may be used in multiple applications.

BACKGROUND OF THE INVENTION

Calibrating the impedance of an output driver on an integrated circuit (IC) can have several advantages. It can reduce reflections on the output signal, reduce electromagnetic interference (EMI), reduce power dissipation, reduce signal skew, and provide termination impedances. In addition, some commonly used signaling schemes such as GTL+ (Gunning Transceiver Logic+) rely upon controlled impedance output drivers to achieve specified voltage swings.

Unfortunately, multiple desired controlled impedances may be necessary because the desired controlled impedance of an output driver may depend upon the location of the driver on a bus, or the type of bus being driven. For example, a GTL+ bus with a 50Ω characteristic impedance can be terminated with 50Ω to $V_{tt}$ internal to the IC at each end of the bus. This can be done by using a controlled impedance pull-up at 50Ω. The 50Ω pull-up is a first desired controlled impedance.

To achieve specified voltage swings, drivers that are located in the middle of the bus may be set to pull-down to ground with an impedance of 12.5Ω. This 12.5Ω pull-down is a second desired controlled impedance.

Twenty-five ohms of pull-down impedance is desired at the end of the bus because, to save power, it is also desirable to turn off the 50Ω termination internal to the IC's at each end of the bus when those IC's are driving. This is a third desired controlled impedance. Finally, a 50Ω pull-down is a fourth controlled impedance that would be desired if the same driver were to be used with a source-terminated bus having a characteristic impedance of 50Ω.

Accordingly, there is a need in the art for a controlled impedance driver that can easily change it's drive impedance for use in multiple applications. It is desirable that each drive impedance be able to use the same calibration information as the other drive impedances. This simplifies the design of the IC because a single set of calibration information can be distributed and used by different drivers to produce the appropriate drive impedance for it's desired application. Finally, it is desirable that only a minimum number of control signals are necessary to switch between impedances.

SUMMARY OF THE INVENTION

In a preferred embodiment, the invention can change the drive impedance of a controlled impedance driver for multiple applications using only one or two control signals. The changes can be set at design time to allow a single driver design to be used on a source-terminated bus, as the termination on a terminated bus, or in the middle of a terminated bus. For each of these applications, the same driver design is used, and each instance of the driver design uses the same calibration information.

An embodiment of a driver according to the invention includes a multiplexer that shifts the calibration bits to the pull-down transistors. This shifting changes which transistors of a split drive transistor are turned on when the pull-down drive transistors are driving. By changing which transistors are turned on, the pull-down impedance of the driver is changed. This shifting is used with a disable function on the pull-up drive-transistor to allow the driver to be used as an end-of-line termination and driver, an open-drain driver, or as a source-terminated driver.

Other aspects and advantages of the present invention will become apparent from the following detailed description, taken in conjunction with the accompanying drawings, illustrating by way of example the principles of the invention.

DETAILED DESCRIPTION OF THE PREFERRED EMBODIMENTS

Figure 1:
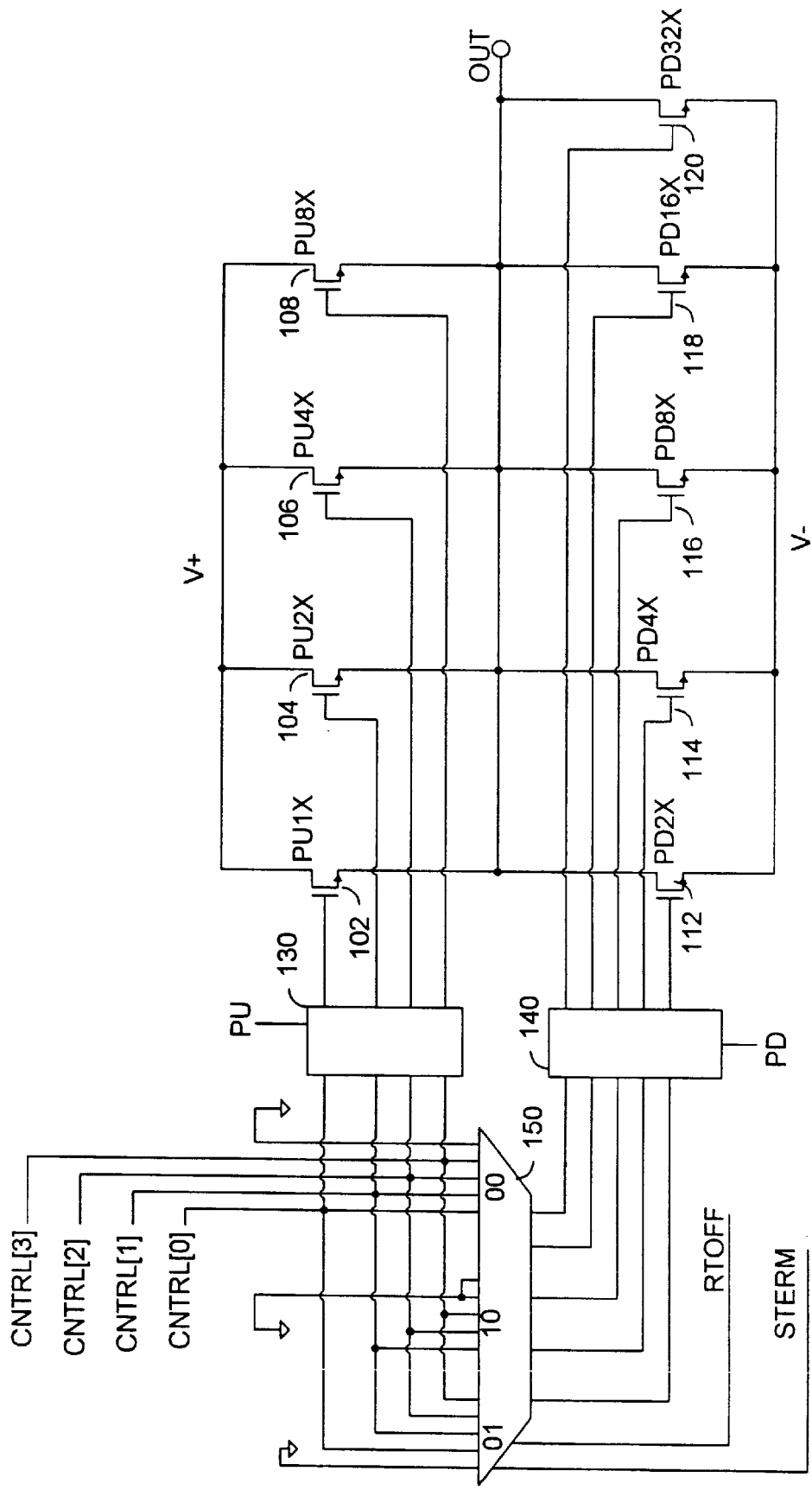
FIG. 1 is a schematic illustration of the final stages of a multi-function output driver.

FIG. 1 is a schematic illustration of the final stages of a multi-function output driver. The impedance of the pull-up strength of the output driver is programmed by separate control circuitry that sets the calibration signals CNTRL [3:0] to values that hold the combination pull-up/termination transistors 102, 104, 106, 108 to an aggregate impedance of 50Ω when the output driver is driving its output high or it is acting as a termination. These calibration signals CNTRL [3:0] control which of transistors 102, 104, 106, and 108 are turned on (or remain off).

Control signals PU and PD control the state of the output driver. When both PU and PD are inactive, then buffering and control circuitry 130, 140 controls the output transistors 102, 104, 106, 108, and 112, 114, 116, 118, 120 to all be off so that the output driver is in a high-impedance (tri-state) state. When PU is active, then buffering and control circuitry 130 controls output transistors 102, 104, 106, 108 to drive the output at a controlled impedance to a logical high voltage level. This can be used to drive a high voltage on the output or to act as a termination. When PD is active, then buffering and control circuitry 140 controls output transistors 112, 114, 116, 118, 120 to drive the output at a controlled impedance to a logical low voltage level.

In a preferred embodiment, transistors 102, 104, 106, and 108 are designed as a binary-weighted network such that calibration signals CNTRL[3:0] can control which of transistors 102, 104, 106, 108 are on when PU is active to provide a 50Ω drive impedance over the process, voltage, and temperature operating conditions of the IC. When signals STERM and RTOFF are low, multiplexer 150 passes calibration signals CNTRL[3:0] to buffering and control circuitry 140 unchanged. These unchanged calibration signals set the pull-down transistors 112, 114, 116, 118, 120 to an aggregate impedance of 25Ω when PD is active. This is done by adjusting the size of the pull-down transistors 112, 114, 116, 118, 120 in relation to the pull-up transistors 102, 104, 106, 108. Normally, this would mean that each pull-down transistor has twice the conductance as the corresponding pull-up transistor that responds to the same calibration signal. In other words, if transistors 102 and 112 are both controlled by calibration signal CNTRL[0], then transistor 112 would have twice the conductance of transistor 102.

When signal STERM is high and RTOFF low, multiplexer 150 right shifts CNTRL[3:0] by one bit position. That is to say, signal CNTRL[3] is shifted by multiplexer 150 to CNTRL[2] before being input to buffering and control circuitry 140. Likewise CNTRL[2] is shifted by multiplexer 150 to CNTRL[1] before being input to buffering and control circuitry 140, and CNTRL[1] is shifted to CNTRL[0] before being input to buffering and control circuitry 140. The input to buffering and control circuitry 140 that was driven by CNTRL[3] is driven to a logical low so that output transistors 118 and 120 will not be turned on, even when PD is active. This shifting has the effect of approximately doubling the aggregate impedance of pull-down transistors 112, 114, 116, 118, 120 to about 50Ω when PD is active.

In a preferred embodiment, transistors 102, 104, 106, 108 (also shown as PU1X, PU2X, PU4X, PU8X, respectively) are used to pull-up the output node, OUT. These transistors are n-channel MOSFETS and are sized as factors of two to each other. If transistor 102, PU1X, would conduct 1 mA into a certain load when on, then transistor 104, PU2X, would conduct 2 mA, transistor 106, PU4X, would conduct 4 mA, and transistor 108 would conduct 8 mA. Since these n-channel MOSFETS are being used as pull-ups, they are in a source-follower configuration with each of their drains being connected to a positive supply voltage V+, and their sources being connected to OUT. To use n-channel MOSFETS as pull-ups, it is desirable, but not necessary, to have a chip power supply voltage that exceeds V+ by at least the turn-on threshold voltage of these n-channel MOSFETS.

P-channel MOSFETS could be used as pull-ups with some changes to the design shown in FIG. 1. To use p-channel MOSFETS, a new set of calibration signals that are calibrated to set the impedance of these p-channel pull-ups should be used instead of CNTRL[0:3]. In addition, the sense of the outputs from buffering and control circuitry 130 should be inverted so that buffering and control circuitry 130 would drive the gate of each p-channel MOSFET low when that transistor should be on.

The gate of each of transistors PU1X, PU2X, PU4X, and PU8X is independently driven by buffering and control circuitry 130. Buffering and control circuitry 130 takes as inputs calibration signals CNTRL[3:0], and the signal PU. These inputs determine when the gate of each of transistors PU1X, PU2X, PU4X, and PU8X is driven either high or low. For example, if the calibration signals CNTRL[3:0] are 1010, respectively, then when PU was active, buffering and control circuitry 130 drives the gates of PU8X and PU2X high, and the gates of PU4X and PU1X low. This results in PU8X and PU2X being on, and PU4X and PU1X being off.

In a preferred embodiment, transistors 112, 114, 116, 118, 120 (also shown as PD2X, PD4X, PD8X, PD16X, and PD32X, respectively) are used to pull-down the output node, OUT. These transistors are n-channel MOSFETS and are sized as factors of two to each other. If transistor 112, PD2X, would conduct 2 mA into a certain load when on, then transistor 114, PD4X, would conduct 4 mA, transistor 116, PD8X, would conduct 8 mA, transistor 118 would conduct 16 mA, and transistor 120 would conduct 32 mA. Since these n-channel MOSFETS are being used as pull-downs, each of their sources is connected to a negative supply voltage V−, and their drains are connected to OUT.

The gate of each of transistors PD2X, PD4X, PD8X, PD16X, and PD32X are independently driven by buffering and control circuitry 140. Buffering and control circuitry 140 takes as inputs calibration signals CNTRL[3:0] as shifted or un-shifted by multiplexer 150, and the signal PD. These inputs determine when the gate of each of transistors PD2X, PD4X, PD8X, PD16X, and PD32X is driven either high or low. For example, if the calibration signals CNTRL[3:0] are 10107, respectively and STERM and RTOFF are low so these signals are not shifted by multiplexer 150, then, when PU is active, buffering and control circuitry 140 drives the gates of PD16X and PD4X high, and the gates of PD32X, PD8X, and PD2X low. This results in PD16X and PD4X being on, and PD32X, PD8X, and PD2X being off.

Figure 2:
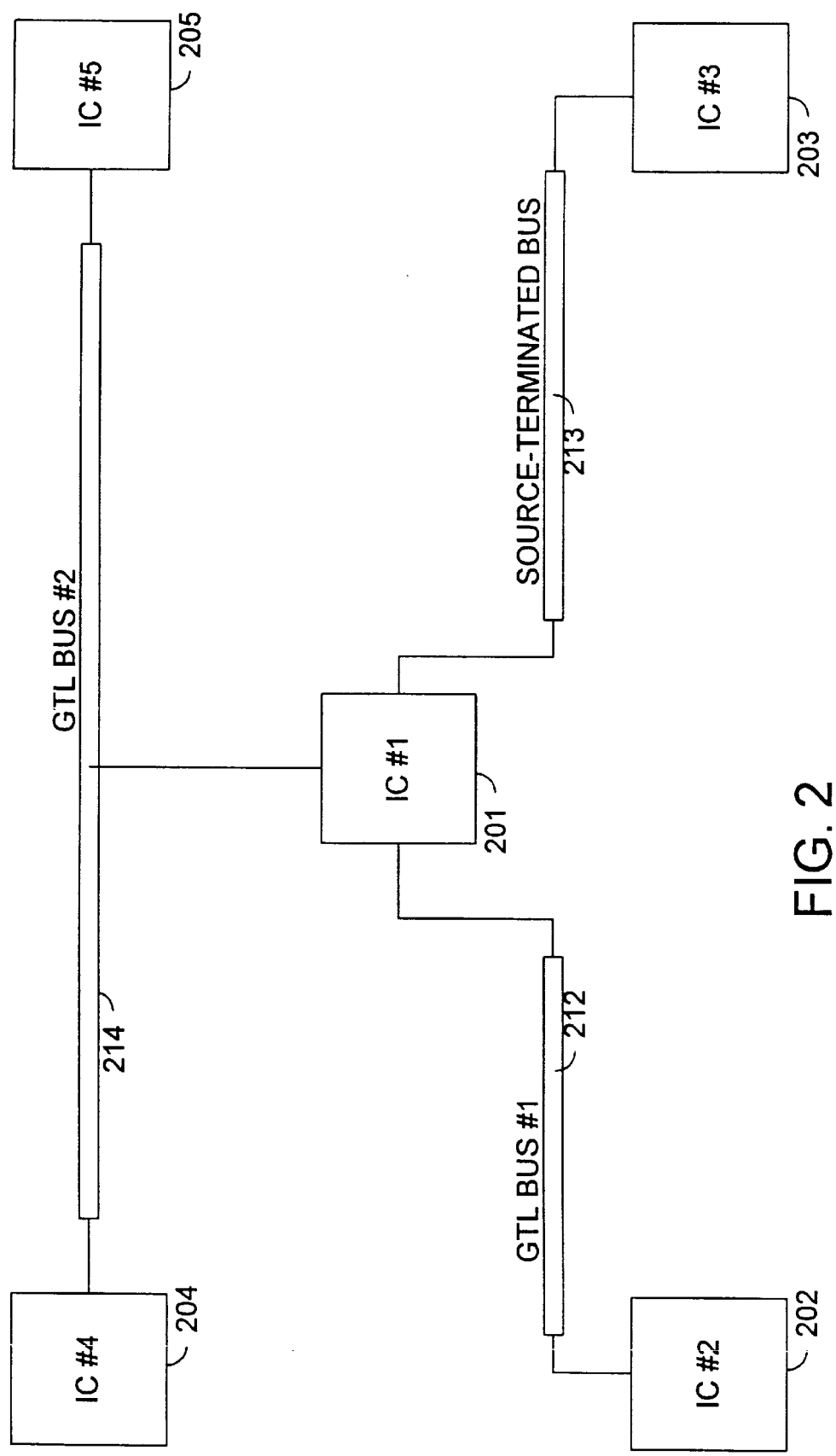
FIG. 2 is an illustration of a single integrated circuit connected to several busses such that a multi-function output driver is desirable.

FIG. 2 is an illustration of a single integrated circuit connected to two busses such that a multi-function output driver is desirable. IC #1 201 is connected to GTL bus #1 212, GTL bus #2 214, and source-terminated bus 213. For each of these busses different functionality and appropriate pull-up and pull-down drive impedances are desired. GTL bus #1 212 is a GTL bus with IC #2 202 connected at one end of the bus, and IC #1 201 connected at the other end of the bus. Accordingly, IC #1 needs to be able to terminate GTL bus 212 as well as drive it. Source-terminated bus 213 is a source-terminated bus connected to IC #3 203 and IC #1 201. IC #1 and IC #3 are shown as being connected at the ends of source-terminated bus 213, however, they could be connected anywhere along the bus. IC #4 204 and IC #5 205 are connected at each end of GTL bus 214, respectively. IC #1 201 is connected to GTL bus #2 214 somewhere in the middle of GTL bus #2 214.

For IC #1's connection to GTL bus #1 212 it is desirable that it terminate the end of the bus with a 50Ω termination impedance, that it switch off that termination impedance when it pulls-down (to save power), and that it pull-down with a controlled impedance of 25Ω. This can be accomplished by setting STERM to a logical zero, setting RTOFF to a logical zero, and keeping PU always active except when PD is active. For IC #1's connection to source-terminated bus 213 it is desirable to pull-down and pull-up with a controlled impedance of 50Ω. This can be accomplished by setting STERM to a logical one, and activating PU when a high level is to be driven on the bus and activating PD when a low level is to be driven on the bus. To avoid a drive-fight, PU and PD should not be activated at the same time.

For IC #1's connection to GTL bus #2 214, it is desirable that it never pull-up. This is because the termination impedances supplied by IC's #4 204 and #5 205 function to pull-up the bus. To accomplish this, PU is always kept inactive. To pull-down GTL bus #2, it is desirable that IC #1 pull-down with a controlled impedance of 12.5Ω. This is accomplished by setting STERM to a logical zero and RTOFF to a logical one. Then, when PD is activated, the output stage will pull-down with a controlled impedance that is 12.5Ω.

Although a specific embodiment of the invention has been described and illustrated, the invention is not to be limited to the specific forms or arrangements of parts so described and illustrated. For example, GTL busses were used to illustrate a type of end-terminated bus, however, this type of multi-function controlled impedance output stage could be used with many different kinds of end-terminated busses. Likewise, some of the busses shown had desired drive or termination impedances of 50Ω, the invention is also applicable to busses with other desired drive or termination impedances. Finally, more transistors in parallel as pull-ups and pull-downs and more impedance control signals could be used to increase the resolution of the controlled drive impedance. The invention is limited only by the claims.

What is claimed is:

1. An integrated circuit, comprising:
a first output driver connected to a first type of bus, wherein said first output driver specifies and supplies a termination impedance, said first output driver also specifies a first controlled pull-down impedance using a first plurality of pull-down transistors; and
a second output driver connected to a second type of bus, said second output driver having the same electrical design as said first output driver, and wherein said second output driver specifies a pull-up impedance that is approximately equal to said termination impedance and said second output driver also specifies a second controlled pull-down impedance using a second plurality of pull-down transistors whereby said second controlled pull-down impedance is generated by shifting a plurality of impedance control signals by a multiplexer that receives a first and second versions of the plurality of impedance control signals.

2. The integrated circuit of claim 1 wherein said second output driver drives said second controlled pull-down impedance and, when said second output driver is driving, said termination impedance is shut off.

3. The integrated circuit of claim 1 wherein said first and second output drivers each comprise:
a plurality of pull-up transistors;
a plurality of pull-down transistors;
a plurality of impedance control signals wherein each of said plurality of impedance control signals controls at least one of said plurality of pull-up transistors thereby achieving a controlled impedance pull-up drive; and
a multiplexer, said multiplexer receiving first and second versions of said plurality of impedance control signals, said multiplexer also having a plurality of outputs that selectively transmit said first and second versions of said plurality of control signals based upon a select signal, and wherein said plurality of outputs control at least one of said plurality of pull-down transistors thereby achieving a controlled impedance pull-down drive.

4. The integrated circuit of claim 3 wherein said first version of said impedance control signals is comprised of said impedance control signals.

5. The integrated circuit of claim 4 wherein said second version of said impedance control signals is a shifted version of at least some of said impedance control signals.

6. The integrated circuit of claim 5 wherein said first version of said impedance control signals on said plurality of outputs produces said controlled impedance pull-down drive that is approximately half the impedance of said controlled impedance pull-up drive.

7. The integrated circuit of claim 6 wherein said second version of said impedance control signals on said plurality of outputs produces said controlled impedance pull-down drive that is approximately the impedance of said controlled impedance pull-up drive.

8. The integrated circuit of claim 7 wherein said impedance control signals control said plurality of pull-up transistors to produce said controlled impedance pull-up drive that is suitable for use as a termination of a GTL+ bus.

9. The integrated circuit of claim 8 wherein said first version of said impedance control signals control said plurality of pull-down transistors to produce said controlled impedance pull-down drive that is suitable for use as a pull-down drive that is not at the end of a GTL+ bus.

10. The integrated circuit of claim 9 wherein said second version of said impedance control signals control said plurality of pull-down transistors to produce said controlled impedance pull-down drive that is suitable for use as a pull-down drive on a soruce-terminated bus.

11. An integrated circuit, comprising:
a first output driver connected to a first type of bus, wherein said first output driver specifies and supplies a termination impedance and said first output driver drives said first type of bus; and
a second output driver connected to a second type of bus, said second output driver having the same electrical design as said first output driver, and wherein said second output driver drives said second type of bus,
wherein said first and second output drivers each comprise:
a plurality of pull-up transistors;
a plurality of pull-down transistors;
a plurality of impedance control signals wherein each of said plurality of impedance control signals controls at least one of said plurality of pull-up transistors thereby achieving a controlled impedance pull-up drive; and
a multiplexer, said multiplexer receiving first and second versions of said plurality of impedance control signals, said multiplexer also having a plurality of outputs that selectively transmit said first and second versions of said plurality of control signals based upon a select signal, and wherein said plurality of outputs control at least one of said plurality of pull-down transistors thereby achieving a controlled impedance pull-down drive.

12. The integrated circuit of claim 11 wherein said first type of bus comprises a GTL bus and wherein said second type of bus comprises a source-terminated bus.

13. The integrated circuit of claim 11 wherein said first output driver generates a controlled pull-down impedance for driving said first type of bus.

14. The integrated circuit of claim 13 wherein said first output driver switches off said termination impedance when said first output driver generates said controller pull-down impedance.

15. The integrated circuit of claim 11 wherein said second output driver selectively generates a controlled pull-down impedance and a controlled pull-up impedance for driving said second type of bus.

16. The integrated circuit of claim 15 wherein said controlled pull-down impedance is approximately equal to said controlled pull-up impedance.

* * * * *